United States Patent [19]
Ishikawa et al.

[11] 3,937,949
[45] Feb. 10, 1976

[54] OPTICAL REMOTE CONTROL APPARATUS EMPLOYING LIGHT SCATTERING PLATE

[75] Inventors: Kiyotsugu Ishikawa, Takatsuki; Tetsuo Kobune, Uji; Hitoo Iwasa, Takatsuki; Iwao Teramoto, Ibaraki, all of Japan

[73] Assignee: Matsushita Electronics Corporation, Japan

[22] Filed: May 30, 1973

[21] Appl. No.: 365,242

[30] Foreign Application Priority Data
May 30, 1972 Japan.............................. 47-53985

[52] U.S. Cl. .................. 250/199; 250/216; 356/221
[51] Int. Cl.² ............................................. H04B 9/00
[58] Field of Search........ 250/199, 221, 237 R, 216, 250/228; 307/88.3; 331/3.5; 332/7.51; 350/188; 340/189 R, 189 M, 190; 356/221

[56] References Cited
UNITED STATES PATENTS

| | | | |
|---|---|---|---|
| 2,275,602 | 3/1942 | Beck et al............................ | 350/188 |
| 2,443,918 | 6/1948 | Lahousse et al..................... | 350/188 |
| 2,444,442 | 7/1948 | Herbold ........................... | 250/237 R |
| 2,818,765 | 1/1958 | Foster................................. | 350/168 |
| 3,330,951 | 7/1967 | Neal..................................... | 350/188 |
| 3,491,237 | 1/1970 | Tillett ................................ | 350/188 |

FOREIGN PATENTS OR APPLICATIONS

230,650  12/1963  Austria .............................. 356/221

OTHER PUBLICATIONS

Ishak, Fiber Optics Photoelectric Colorimeter, Optica Acta, 1970, Vol. 17, No. 10, 725–732.

*Primary Examiner*—George H. Libman
*Attorney, Agent, or Firm*—Craig & Antonelli

[57] ABSTRACT

An improvement in optical remote-control apparatus which comprises a light-beam transmitter and a light-receiver, wherein the improvement is that a light-scattering (i.e., light-diffusing) plate having a suitable area is provided in front of the light-receiver, so that the aiming tolerance of the light-beam transmitter becomes broader, enabling easy remote-control.

1 Claim, 3 Drawing Figures

OPTICAL REMOTE CONTROL APPARATUS EMPLOYING LIGHT SCATTERING PLATE

BACKGROUND OF THE INVENTION

This invention relates to an optical remote-control apparatus capable of controlling an appliance by a remote-control means by employing a light signal.

In an optical signal transmission system, for instance, one used in optical communications, it is important to converge the light to form a collimated beam, in order that the rays do not scatter even after arrival at a remote light-receiver after travelling a long distance. For attaining such a purpose, the light-beam transmitter, as well as the light-beam receiver, have been provided with such converging means as a parabolic mirror, spherical mirror or converging lens in order to make their sensitivity high. When such converging means are provided for both the transmitter and the receiver, both light axes of both converging means should coincide exactly with each other for obtaining reliable remote-controlability. In order to attain such coincidence of the light axes, a telescope, for instance, has been used. However, in the application of the optical remote-control apparatus for home appliances such as a television receiver, air conditioner, etc., employment of such sophisticated apparatus as an aiming telescope is not appropriate in view of its handling inconvenience as well as its size and weight.

SUMMARY OF THE INVENTION

This invention purports to eliminate the above-mentioned drawback of the conventional optical remote-controlling apparatus and to provide an improved compact optical remote-control apparatus capable of easy aiming at a light-receiver with a light-transmitter, suitable for use in home appliances, for instance, such as television receiver, radio set or air conditioner.

DETAILED DESCRIPTION OF THE INVENTION

Figure 1:
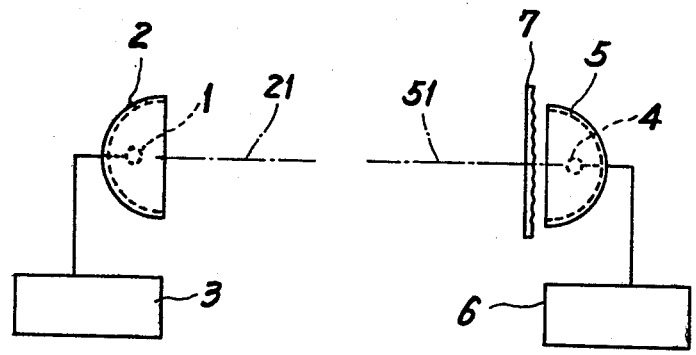
FIG. 1 is the side-view of the apparatus of the optical remote-control apparatus of the present invention.

In FIG. 1 showing a side-view of the apparatus embodying the present invention, a light-beam transmitter comprises a signal generator 3 for generating electric signals, a light-emitting element 1, such as a light-emitting diode, which receives electric signals from the signal generator 3 and emits light-signals, and a reflecting mirror 2 for effectively converging the light-signal of the light-emitting element 1 so as to form a parallel or collimated beam. A light-receiver comprises a light-scattering plate 7, a photo-electric element 4, a light-reflecting mirror 5 and an output circuit 6.

An infra-red light-emitting diode consisting mainly of a gallium-arsenide compound semiconductor which diode emits infra-red light which is nearly monochromic having a peak wavelength of 9500 A and a half-value spectrum width of 500 A when an input forward current flows therethrough, is used as the light-emitting element 1. For the converging mirror 2, a parabolic mirror or a semi-spherical mirror is used, so as to converge or focus the light from the light-emitting element 1 to form a parallel light beam to reach the remote light-receiver. Signal generator 3 comprises a pulse generator which generates electric pulses modulated by desired information.

For the photoelectric element 4, a solid state element having a sensitivity in infra-red region, such as a silicon photo-transistor or a silicon photo-diode, is preferable. The photo-electric element 4 is located at a suitable point of the reflecting mirror 5 so that the transmitted light having passed through the light-scattering plate 7 and being scattered is focused or converged on the photoconductive area of the element 4.

The output circuit 6 comprises a demodulating circuit which decodes or demodulates the electric signals produced by the photoelectric element 4 and produces a desired controlling of the output signals.

The light-scattering plate 7 is located in front of the photoelectric element 4 and the reflecting mirror 5 so as to scatter the incoming parallel light beam from the light-transmitter in order to ease the aiming tolerance of the light transmitter.

As described in the above, such a light-scattering plate is for scattering an incident parallel light beam, so that the incident light beam 21 deviated by a specified solid angle around the theoretical light-axis 51 of the light-receiver can reach the photo-electric element 4. For instance a plate which is transparent for infra-red light and has an inhomogeneous structure with respect to its refractive index can be used for the plate 7. For instance, a transparent plastic plate containing a number of particles of transparent material having a large refractive index, such as titanium oxide or glass, can be used for the plate 7. One practical example of such a plate is an epoxy-resin plate containing a number of glass particles of 5 to 15 microns in diameter.

Figure 3:
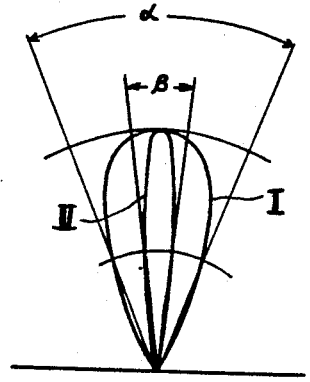
FIG. 3 is a pattern showing angular response of the apparatus.

FIG. 3 is a chart showing the angular response of such a plate 7 with respect to the direction of the incident light when the plate 7 is used as shown in FIG. 1. The curve I indicates the angular response for the light-receiver with the above-mentioned plate, while the curve II indicates the angular response for the light-receiver without the plate. As is shown by the curve I of FIG. 3, when the plate containing particles of a higher refraction coefficient than the substance of surrounding plastic substrate is provided in front of the light-receiving element and the mirror, a suitably widened angular characteristic is obtainable.

Figure 2:
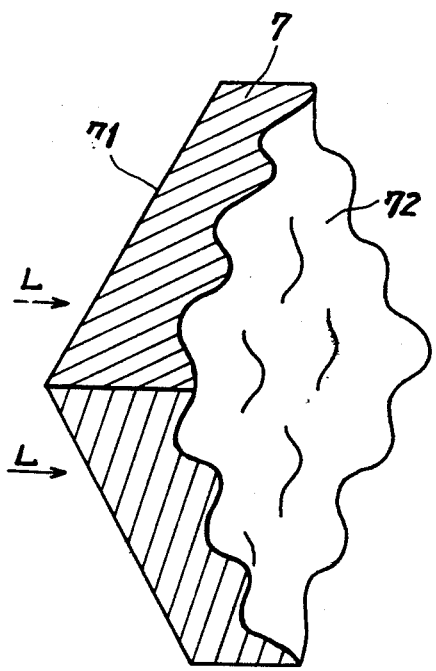
FIG. 2 is an enlarged perspective view of a part of the light-scattering plate 7 provided in front of the light-receiver.

Another example of the light-scattering plate is constituted by a transparent glass plate one face of which has a roughened surface. One practical example of such a roughened face plate is shown in FIG. 2, which is an enlarged perspective view of a part of the light-scattering plate, wherein the front face 71 (i.e., light-receiving face) of the plate is made flat while the rear face 72 is roughened. The roughened rear face 72 preferably has an unevenly curved face, the normal (i.e., a line perpendicular to the surface) to which is directed in various directions. This example also has the same angular response as shown by curve I in FIG. 3.

A further example of the light-scattering plate is constituted by coating a transparent plastic layer on a roughened face of a transparent glass plate. The angular response is the same with the above examples.

When the light-scattering plate is made of a plastic which is transparent only for infra-red light then it is possible to eliminate light rays other than the infra-red signal light, hence to eliminate background-noise in the electric output signal of the photoelectric element 4 due to various light rays other than the infra-red light.

By employing the light-scattering plate 7 according to the present invention, the aiming tolerance of the light-transmitter at the light-receiver is suitably broadened without an adverse increase of weight or size or inconvenience, hence enabling easier aiming of the light-transmitter.

What we claim is:

1. In an optical-remote-control apparatus including a light beam transmitter and a light-receiver disposed remote with respect to said transmitter, the improvement wherein a light-scattering plate is provided in front of said light-receiver and is arranged so as to have the entirety of its light receiving face exposed to the light beam from said transmitter irrespective of the direction from which said light beam impinges upon said light receiving face, said plate being transparent and the light receiving face thereof being substantially flat and the rear face thereof being roughened, said receiver including a photodetecting element and a focusing element disposed relative to said photodetecting element for focusing impinging light onto said photodetecting element, said focusing element comprising a reflecting focusing mirror disposed behind said photodetecting element, and wherein said light-scattering plate is disposed relative to said focusing element to scatter said impinging light thereonto, and thereby increase the angular response characteristic of said light-receiver.

* * * * *